(12) United States Patent
Gao et al.

(10) Patent No.: US 11,396,080 B2
(45) Date of Patent: Jul. 26, 2022

(54) CHEMICAL MECHANICAL POLISHING APPARATUS HAVING SCRAPING FIXTURE

(71) Applicant: YANGTZE MEMORY TECHNOLOGIES CO., LTD., Wuhan (CN)

(72) Inventors: Lin Gao, Wuhan (CN); Yangbo Jiang, Wuhan (CN); Guangyi Wang, Wuhan (CN); Juncheng Yang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 870 days.

(21) Appl. No.: 16/218,464

(22) Filed: Dec. 12, 2018

(65) Prior Publication Data

US 2020/0130132 A1     Apr. 30, 2020

Related U.S. Application Data

(63) Continuation of application No. PCT/CN2018/111595, filed on Oct. 24, 2018.

(51) Int. Cl.
*B24B 7/00* (2006.01)
*B24B 37/10* (2012.01)
(Continued)

(52) U.S. Cl.
CPC ............ *B24B 37/107* (2013.01); *B24B 37/20* (2013.01); *B24B 37/32* (2013.01); *H01L 21/67092* (2013.01)

(58) Field of Classification Search
CPC ....... B24B 37/107; B24B 37/20; B24B 37/32; H01L 21/67092
(Continued)

(56) References Cited

U.S. PATENT DOCUMENTS 6,638,868 B1\* 10/2003 Shih ...................... B24B 37/042
156/345.55
6,962,524 B2\* 11/2005 Butterfield ............... B23H 5/06
257/E21.304
(Continued)

FOREIGN PATENT DOCUMENTS

CN          1505109 A      6/2004
CN          1672876 A      9/2005
(Continued)

OTHER PUBLICATIONS

International Search Report issued in corresponding International Application No. PPCT/CN2018/111595, dated Jul. 22, 2019, 6 pages.
(Continued)

*Primary Examiner* — Joseph J Hail
*Assistant Examiner* — Shantese L McDonald
(74) *Attorney, Agent, or Firm* — Bayes PLLC (57) ABSTRACT

Embodiments of apparatus and method for chemical mechanical polishing (CMP) are disclosed. In an example, an apparatus for CMP includes a platen, a slurry supply, and at least one scraping fixture. The platen is configured to rotate a pad thereon about a central axis of the pad. The slurry supply is configured to supply a slurry onto the pad while the pad rotates. The at least one scraping fixture is configured to scrape the slurry off the pad when the slurry travels a distance between the slurry supply and the at least one scraping fixture in a circumferential direction of the pad as the pad rotates.

20 Claims, 6 Drawing Sheets

(51) Int. Cl.
*B24B 37/20* (2012.01)
*B24B 37/32* (2012.01)
*H01L 21/67* (2006.01)

(58) Field of Classification Search
USPC .......................................... 451/119, 41, 285
See application file for complete search history.

(56) References Cited

U.S. PATENT DOCUMENTS

| | | | |
|---|---|---|---|
| 2002/0108861 A1* | 8/2002 | Emesh | H01L 21/7684 205/81 |
| 2004/0192176 A1 | 9/2004 | Chopra et al. | |
| 2005/0130566 A1* | 6/2005 | Kajiwara | B24B 37/04 451/41 |
| 2014/0273753 A1 | 9/2014 | Matsuo et al. | |
| 2020/0039029 A1* | 2/2020 | Sotozaki | B24B 49/14 |

FOREIGN PATENT DOCUMENTS

| | | |
|---|---|---|
| CN | 102229101 A | 11/2011 |
| CN | 102407482 A | 4/2012 |
| CN | 204075983 U | 1/2015 |
| CN | 204504984 U | 7/2015 |
| CN | 107107304 A | 8/2017 |
| JP | 2001053039 A | 2/2001 |
| TW | 396084 B | 7/2000 |
| TW | 478430 U | 3/2002 |
| TW | 565486 B | 12/2003 |
| TW | 201501869 A | 1/2015 |
| TW | 201641217 A | 12/2016 |

OTHER PUBLICATIONS

Written Opinion of the International Searching Authority issued in corresponding International Application No. PCT/CN2018/111595, dated Jul. 22, 2019, 4 pages.

* cited by examiner

CHEMICAL MECHANICAL POLISHING APPARATUS HAVING SCRAPING FIXTURE

CROSS REFERENCE TO RELATED APPLICATION

This application is continuation of International Application No. PCT/CN2018/111595, filed on Oct. 24, 2018, entitled "CHEMICAL MECHANICAL POLISHING APPARATUS HAVING SCRAPING FIXTURE," which is hereby incorporated by reference in its entirety.

BACKGROUND

Embodiments of the present disclosure relate to semiconductor device manufacturing apparatus and method of using the same.

Chemical mechanical polishing (CMP, also known as "chemical mechanical planarization") is a process of smoothing wafer surface with the combination of chemical etching and free abrasive mechanical polishing. Mechanical grinding alone causes too much surface damage, while wet etching alone cannot attain good planarization. Most chemical reactions are isotropic and etch different crystal planes with different speed. CMP involves both processes at the same time.

In semiconductor fabrication, CMP process is used to planarize oxide, polysilicon, or metal layers (e.g., copper, aluminum, tungsten, etc.) in order to prepare them for the following lithographic step, avoiding depth focus problems during illumination of photosensitive layers. It is the preferred planarization step utilized in deep sub-micron semiconductor device manufacturing.

SUMMARY

Embodiments of apparatus and method for CMP are disclosed herein.

In one example, an apparatus for CMP includes a platen, a slurry supply, and at least one scraping fixture. The platen is configured to rotate a pad thereon about a central axis of the pad. The slurry supply is configured to supply a slurry onto the pad while the pad rotates. The at least one scraping fixture is configured to scrape the slurry off the pad when the slurry travels a distance between the slurry supply and the at least one scraping fixture in a circumferential direction of the pad as the pad rotates.

In another example, an apparatus for CMP includes a platen, a slurry supply, a carrier, and at least one scraping fixture. The platen is configured to rotate a pad thereon about a central axis of the pad. The slurry supply is configured to supply a fresh slurry onto the pad while the pad rotates. The carrier is configured to hold a wafer on the pad while the pad rotates. The fresh slurry flows between the wafer and the pad as the pad rotates and thereby becomes a used slurry. The at least one scraping fixture is configured to scrape the used slurry off the pad while the pad rotates.

In a different example, a method for CMP is disclosed. A pad is rotated about a central axis of the pad. A fresh slurry is supplied onto the pad while the pad rotates. A wafer is held on the pad while the pad rotates. The wafer is polished by the fresh slurry when the fresh slurry flows between the wafer and the pad as the pad rotates, thereby becoming a used slurry. The used slurry is scraped off the pad by a scraping fixture while the pad rotates.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

Figure 1:
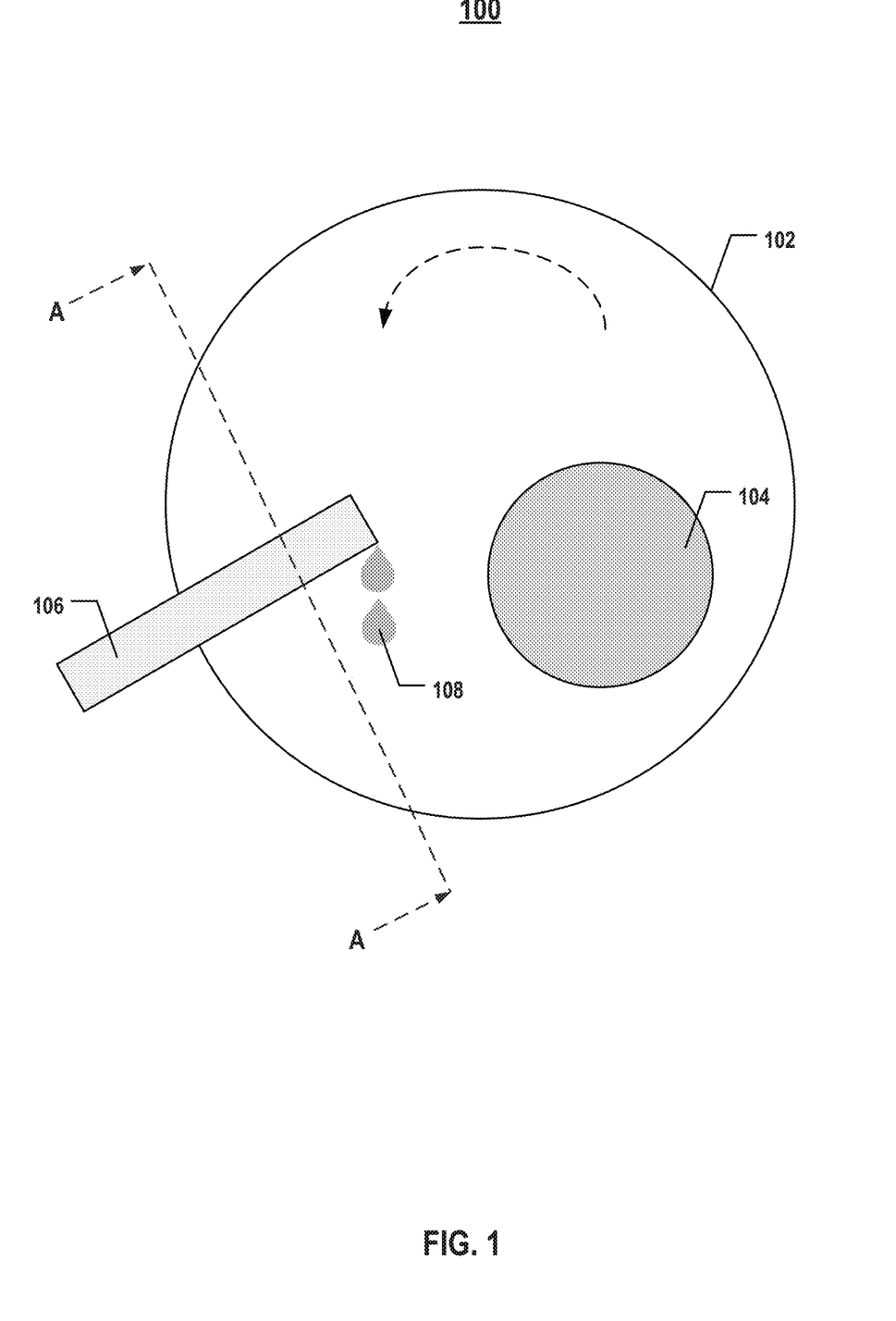
FIG. 1 illustrates a plan view of an apparatus for CMP.

The CMP process uses an abrasive and corrosive chemical slurry (commonly a colloid) in conjunction with a polishing pad and planarizes the wafer surface by relative motion between the wafer and the polishing pad in the presence of slurry while applying pressure. For example, FIG. 1 illustrates a plan view of an apparatus 100 for CMP. Apparatus 100 includes a pad 102 (e.g., a polishing pad), a carrier 104 for holding a wafer on pad 102, and a slurry supply 106 that supplies a fresh slurry 108 onto pad 102 while pad 102 rotates. Due to the centrifugal force as pad 102 rotates, fresh slurries 108 flow radially on pad 102 to be distributed on pad 102. The rotation of pad 102 also brings fresh slurry 108 to the contacting surface between the wafer (not shown) held under carrier 104 and pad 102 in the circumferential direction (indicated by the curved arrow in FIG. 1) of pad 102, which is used for polishing the wafer. The used slurry (not shown) may be later spanned off pad 102 by the centrifugal force as well.

Figure 2:
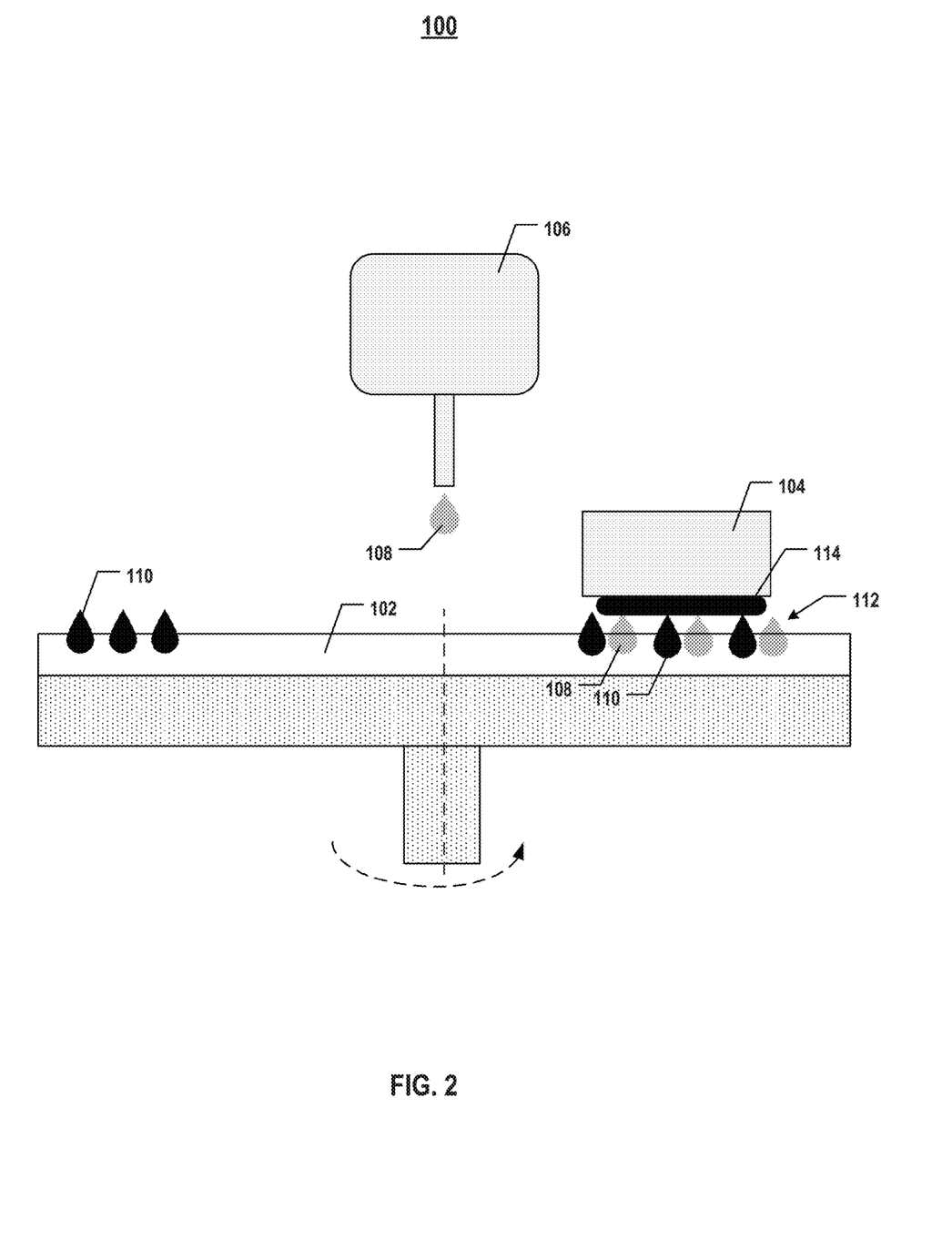
FIG. 2 illustrates a side view of the apparatus for CMP as illustrated in FIG. 1.

However, in the known CMP processes, the removal of the used slurry is solely relied on the centrifugal force and thus, is not very effective. As shown in FIG. 2, which is a side view of apparatus 100 in FIG. 1 along the AA direction, while some used slurries 110 can be spanned off pad 102, other used slurries 110 are mixed with fresh slurries 108 as mixed slurries 112 at the contacting surface between a wafer 114 and pad 102. That is, used slurries 110 cannot be completely replaced by fresh slurries 108 for polishing wafer 114. Metal protective additive is added into fresh slurry 108 to prevent slurry erosion of metal structures on wafer 114 (e.g., interconnects). The metal protective additive, however, is consumed by the CMP process and thus, does not exist in used slurry 110. As a result, mixed slurries 112, which include used slurries 110, can erode the metal structures on wafer 114 if used slurries 110 cannot be timely removed from pad 102. Moreover, the electric charges accumulated during the CMP process cannot be discharged, thereby further enhancing the erosion and corrosion of the metal structures on wafer 114 due to electrochemical reactions.

Various embodiments in accordance with the present disclosure provide an improved apparatus for CMP, which includes one or more scraping fixtures for timely and effectively removing the used slurries from the polishing pad, thereby reducing the damages to the wafer caused by the used slurries. In some embodiments, the scraping fixture includes a conductor that can ground the polishing pad during the CMP process to discharge the electric charges accumulated by the CMP process, thereby reducing the electrochemical corrosion of the metal structures on the wafer. As a result, the CMP process becomes more reliable and controllable by the improved apparatus. The improved apparatus is suitable for various types of CMP processes, such as metal CMP, dielectric CMP, and polysilicon CMP.

In some embodiments, the improved apparatus for CMP disclosed herein can be used for metal planarization, such as damascene process involving metals like copper, tungsten, or aluminum to fill vertical interconnect accesses (vias) or trenches in order to prepare electrical interconnects. In some embodiments, the improved apparatus for CMP disposed herein can be used for dielectric planarization, such as planarizing silicon oxide interlayer dielectrics (ILDs). The dielectric CMP process can be repeated for every layer of wiring that is added. Also, the dielectric CMP can be used in forming shallow trench isolations (STIs) that separate active devices, for example, transistors on the substrate. In some embodiments, the improved apparatus for CMP disposed herein can be used for polysilicon planarization, such as polishing polysilicon plugs or vias, removing the polysilicon from the ILDs, and leaving only the plug filled with polysilicon. Also, the polysilicon CMP can be used for the end phase of wafer thinning or silicon wafer polishing.

Figure 3:
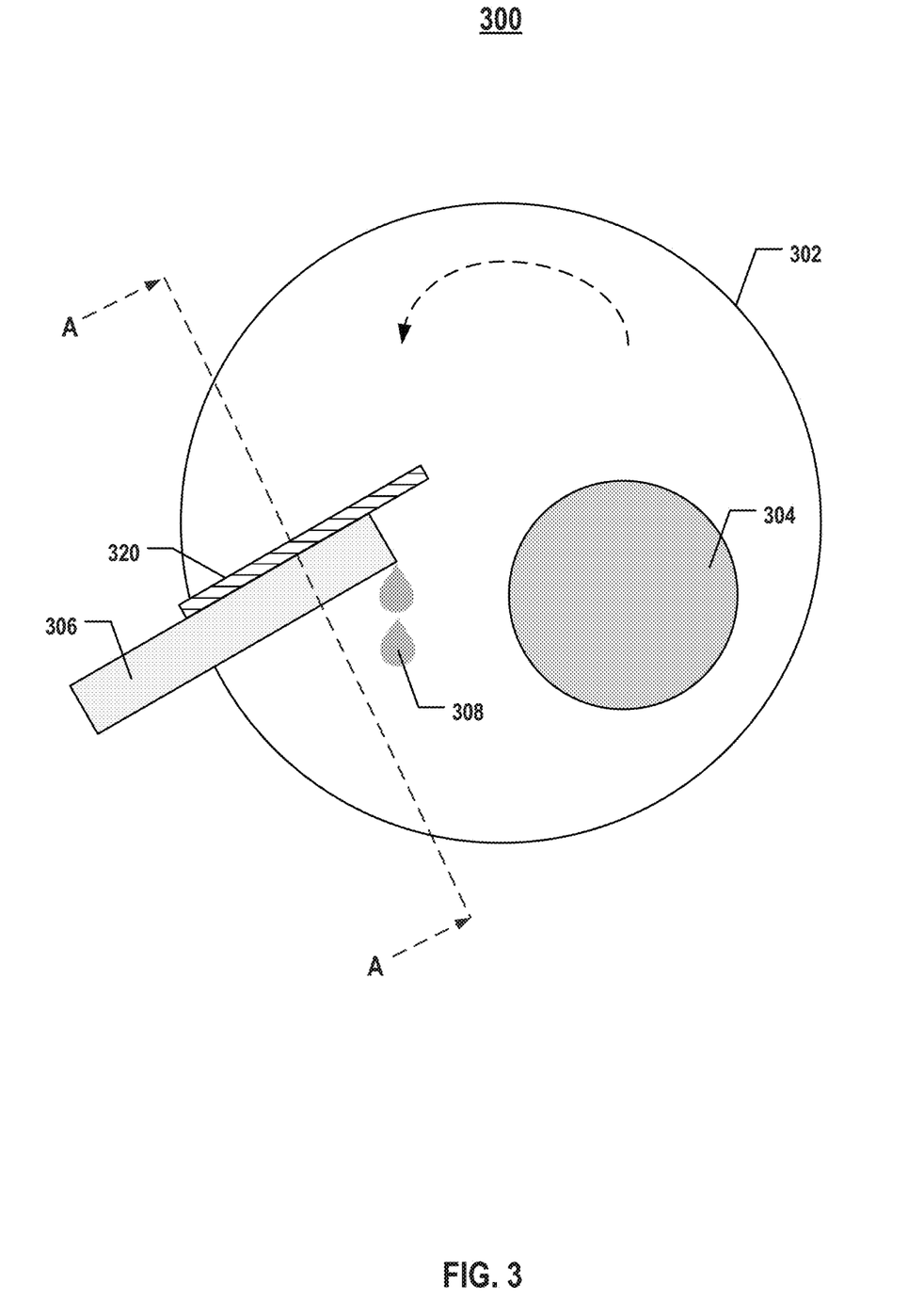
FIG. 3 illustrates a plan view of an exemplary apparatus for CMP having a scraping fixture, according to some embodiments of the present disclosure.
Figure 4:
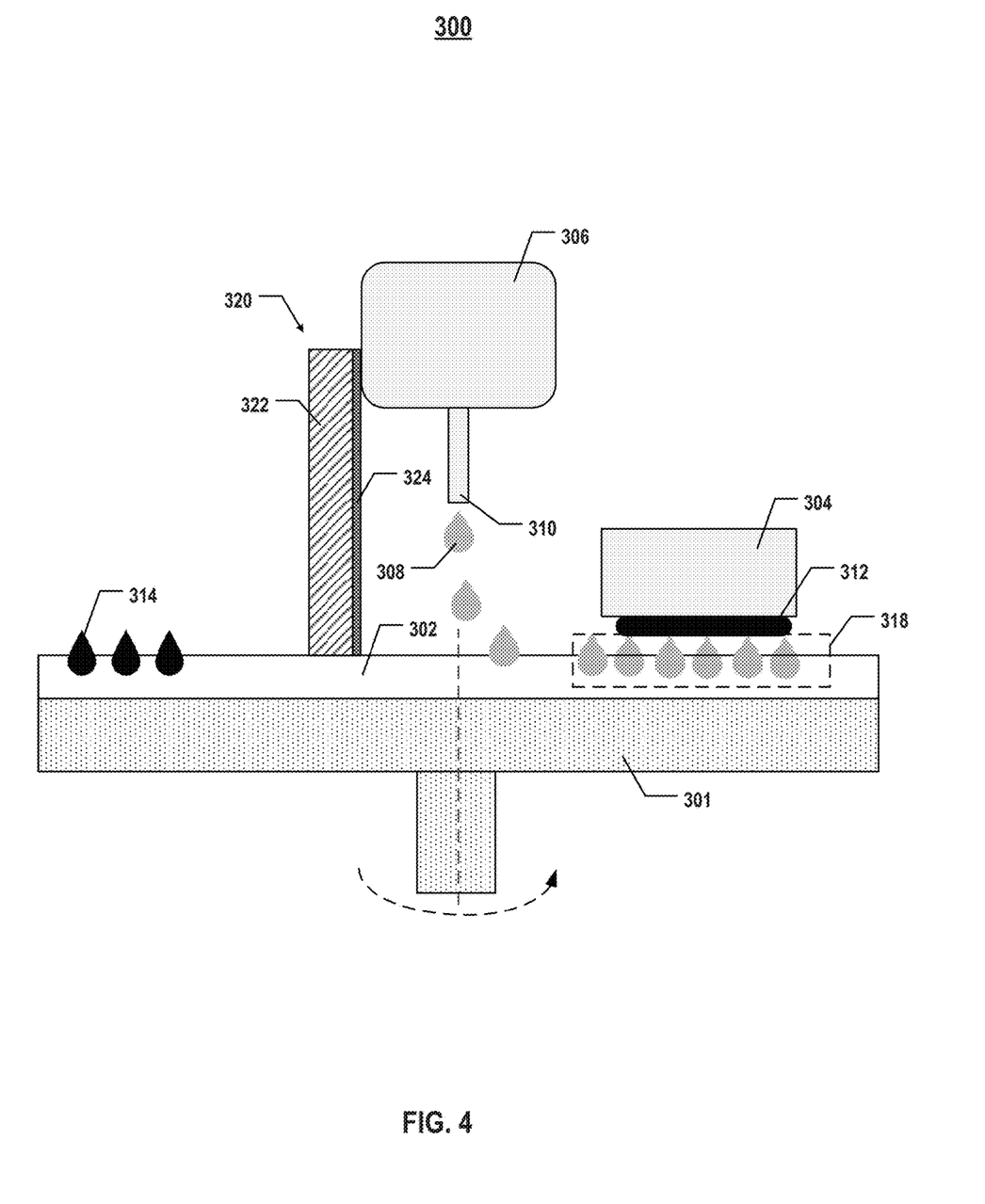
FIG. 4 illustrates a side view of the exemplary apparatus for CMP having a scraping fixture as illustrated in FIG. 3, according to some embodiments of the present disclosure.

FIG. 3 illustrates a plan view of an exemplary apparatus 300 for CMP having a scraping fixture 320, according to some embodiments of the present disclosure. FIG. 4 illustrates a side view of exemplary apparatus 300 for CMP having scraping fixture 320 as illustrated in FIG. 3 along the AA direction, according to some embodiments of the present disclosure. As shown in FIGS. 3-4, apparatus 300 can include a platen 301, a pad 302 (e.g., polishing pad) disposed on platen 301, a carrier 304 (e.g., a wafer carrier), a slurry supply 306, and a scraping fixture 320. Platen 301 is configured to rotate about a central axis and has an extremely flat circular top surface covered by pad 302, according to some embodiments. Accordingly, platen 301 can rotate concentric pad 302 thereon about the central axis at a certain rotation speed during the period of rotation depending on the specification of the CMP process. In some embodiments, platen 301 includes a temperature control system (not shown) that can adjust the temperature at pad 302 between, for example, 10° C. and 70° C., using back spray and/or a water-cooled support.

Pad 302 can be stacks of soft and hard materials that conform to wafer topography to some extent. In some embodiments, pad 302 is made from porous polymeric materials with a pore size between, for example, 30 μm and 50 μm. Because the pore structures of pad 302 can be consumed in the CMP process, pad 302 can be reconditioned to regenerate the pore structures during the CMP process by a pad conditioner (not shown). As shown in FIG. 3, pad 302 has a circular shape that covers the top flat surface of platen 301. As platen 301 rotates about the central axis, concentric pad 302 also rotates about the central axis and has a circumferential direction as indicated by the cured arrow in FIG. 3, according to some embodiments.

Carrier 304 can have a retaining ring (not shown) in which a wafer 312 can be mounted upside-down to keep wafer 312 in the desired lateral position. Carrier 304 is above (in the side view) and within (in the plan view) pad 302, according to some embodiments. During the CMP process, carrier 304 is configured to hold wafer 312 while pad 302 rotates, for example, by vacuum. A downward pressure/down force can be applied to carrier 304 to push wafer 312 against the top surface of pad 302. In some embodiments, carrier 304 and concentric wafer 312 held thereby rotate about their central axis and keep oscillating as well during the CMP process.

Slurry supply 306 can supply a fresh slurry 308 from above pad 302 onto pad 302, for example, by dripping fresh slurry 308 via a slurry tube 310. Fresh slurry 308 can include suspensions of abrasive materials dispensed in wafer (commonly a colloid) with other additives, such as rust inhibitors, metal protective additive, and bases to provide an alkalic condition. Depending on the specification of the CMP process (e.g., metal, dielectric, or polysilicon CMP), the abrasive materials in fresh slurry 308 can include, but not limited to, silicon oxide, cerium oxide, or aluminum oxide. In some embodiments, slurry supply 306 is configured to supply fresh slurry 308 onto pad 302 while pad 302 rotates. Due to the centrifugal force, fresh slurries 308 continuously falling on pad 302 flow radially on pad 302 to be distributed on pad 302. In the meanwhile, the rotation of pad 302 can also cause fresh slurries 308 to move in the circumferential direction of pad 302 with respect to the stationary components, such as carrier 304 and slurry supply 306, to a contacting surface 318 between wafer 312 and pad 302. Fresh slurries 308 at contacting surface 318 can be used for polishing wafer 312. In some embodiments, fresh slurry 308 flows between wafer 312 and pad 302 as pad 302 rotates and thereby becomes a used slurry 314. In some embodiments, compared with fresh slurry 308, used slurry 314 lacks the metal protective additive and thus, may cause damages to the metal structures on wafer 312.

Scraping fixture 320 can be configured to scrape used slurries 314 off pad 302 while pad 302 rotates. Scraping fixture 320 is fixed relative to pad 302 which keeps rotating during the CMP process, according to some embodiments. As shown in the plan view of FIG. 3, scraping fixture 320 can be disposed between carrier 304 and slurry supply 306 in the circumferential direction of pad 302 as pad 302 rotates. As a result, along the circumferential direction of pad 302 as pad 302 rotates (i.e., the counterclockwise in FIG. 3), each fresh slurry 308 first moves from slurry supply 306 to carrier 304 for polishing wafer 312 held by carrier 304, and resulting used slurry 314 then moves toward scraping fixture 320 until being scraped off pad 302, according to some embodiments. That is, scraping fixture 320 is configured to scrape any slurry off pad 302 when the slurry travels a distance between slurry supply 306 and scraping fixture 320 in the circumferential direction of pad 302 as pad 302 rotates. As a result, used slurry 314 cannot move beyond scraping fixture 320 in the circumferential direction of pad 302 as pad 302 rotates to reach contacting surface 318 again. Thus, used slurries 314 would not be mixed with fresh slurries 308 at contacting surface 318 between wafer 312 and pad 302 to cause erosion and corrosion of the metal structures on wafer 312. In some embodiments, scraping fixture 320 is attached to slurry supply 306 as shown in FIGS. 3-4, so a slurry can only travel a distance in the circumferential direction of pad 302 that is about the same as the perimeter of pad 302. It is understood that depending on the specific location of the scraping fixture in the plan view, a slurry may travel a distance in the circumferential direction of pad 302 that is less than the perimeter of pad 302.

As shown in FIG. 4, scraping fixture 320 can include a scraper 322 having a lower end abutting the top surface of pad 302 while pad 302 rotates. In some embodiments, the lower end of scraper 322 is made of polymer including, but not limited to, polyphenylene sulfide (PPS), polyether ether ketone (PEEK), polyethylene terephthalate (PET), or any combinations thereof. The lower end of scraper 322 can be made of any other suitable materials that have good elasticity, toughness or strength and that do not cause damages to pad 302 and/or wafer 312. In some embodiments, the lower end of scraper 322 and the retaining ring of carrier 304 are made of the same material.

In some embodiments, scraper 322 is configured to apply a pressure (e.g., a downward pressure/down force) against the top surface of pad 302 to stop used slurry 314 from rotating with pad 302. As scraper 322 extends radially in the plan view as shown in FIG. 3, scraped used slurry 314 can flow off pad 302 along scraper 322. In some embodiments, used slurries 314 retained in the pore structures of pad 302 are removed by the pressure applied between the lower end of scraper 322 and the top surface of pad 302 and thus, can flow on the top surface of pad 302 again. Scraper 322 can guide used slurries 314 to flow radially (with respect to pad 302) along the edge of scraper 322 until used slurries 314 flow off pad 302. In some embodiments, the pressure applied by scraper 322 is preset at a value that is sufficient strong to stop used slurry 314 from rotating with pad 302 and at the same time, not too strong to affect the rotation of pad 302 and/or cause damages to pad 302. The pressure applied by scraper 322 is monitored in real-time and dynamically adjusted accordingly, according to some embodiments.

As shown in FIG. 4, scraping fixture 320 can also include a conductor 324 electrically coupled to pad 302 to ground pad 302 while pad 302 rotates. Conductor 324 can include any suitable conductive materials including metals, such as copper, aluminum, silver, gold, tungsten, or any combinations thereof. Conductor 324 can be in any suitable shapes as well, such as one or more wires, plates, or any combinations thereof. As described above, electric charges can be accumulated on pad 302 during the CMP process, which can cause electrochemical corrosion with used slurries 314. In some embodiments, one end of conductor 324 is electrically coupled to pad 302, and another end of conductor 324 is electrically coupled to slurry supply 306 (e.g., the meal part of slurry supply 306) to transfer the electric charges off pad 302. It is understood that in some embodiments, another end of conductor 324 is electrically coupled to any metal parts of components of apparatus 300 as long as conductor 324 can ground pad 302. It is further understood that in some embodiments, conductor 324 is not an integrated part of scraping fixture 320. Nevertheless, by grounding pad 302 by conductor 324 during the CMP process, damages to pad 302 caused by the accumulation of used slurries 314 can be further reduced.

Figure 5A:
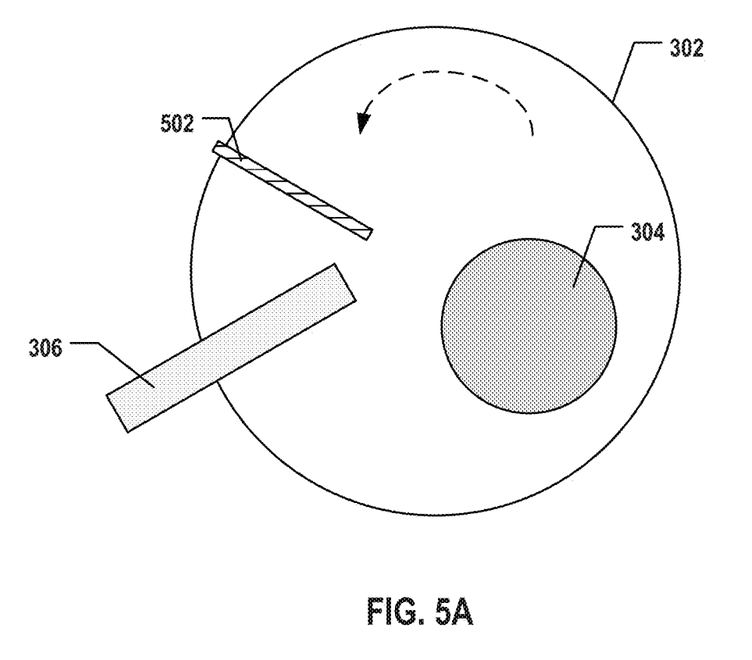
FIG. 5A illustrates a plan view of another exemplary apparatus for CMP having a scraping fixture, according to some embodiments of the present disclosure.

Although FIGS. 3-4 illustrate a single scraping fixture 320 attached to slurry supply 306, it is understood that the number and/or locations of the scraping fixtures can vary in various embodiments. For example, FIG. 5A illustrates a plan view of another exemplary apparatus for CMP having a scraping fixture 502, according to some embodiments of the present disclosure. As shown in FIG. 5A, instead of attaching to slurry supply 306, scraping fixture 502 can be separated from slurry supply 306, but still between carrier 304 and slurry supply 306 in the circumferential direction of pad 302 as pad 302 rotates (e.g., the counterclockwise in FIG. 5A). As a result, a slurry will be scraped off pad 302 before it travels the entire perimeter of pad 302 to reach slurry supply 306. Other than its location, scraping fixture 502 can be substantially the same as scraping fixture 320 described above with respect to FIGS. 3-4.

Figure 5B:
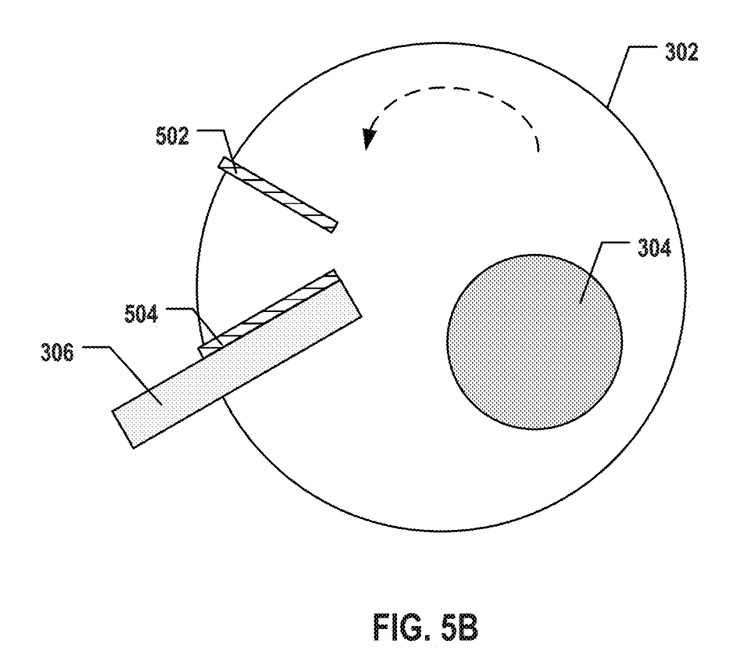
FIG. 5B illustrates a plan view of still another exemplary apparatus for CMP having multiple scraping fixtures, according to some embodiments of the present disclosure.

In another example, FIG. 5B illustrates a plan view of still another exemplary apparatus for CMP having multiple scraping fixtures 502 and 504, according to some embodiments of the present disclosure. In addition to first scraping fixture 502, a second scraping fixture 504 can be attached to slurry supply 306 to ensure that a used slurry that has not been scraped off pad 302 by first scraping fixture 502 can be removed by second scraping fixture 504 before it can be mixed with fresh slurries. First and second scraping fixtures 502 and 504 are spaced apart along the circumferential direction of pad 302, according to some embodiments. It is understood that second scraping fixture 504 can be separated from slurry supply 306 as well, just like first scraping fixture 502. It is further understood that more scraping fixtures can be added and spaced apart along the circumferential direction of pad 302 in other embodiments.

Figure 6:
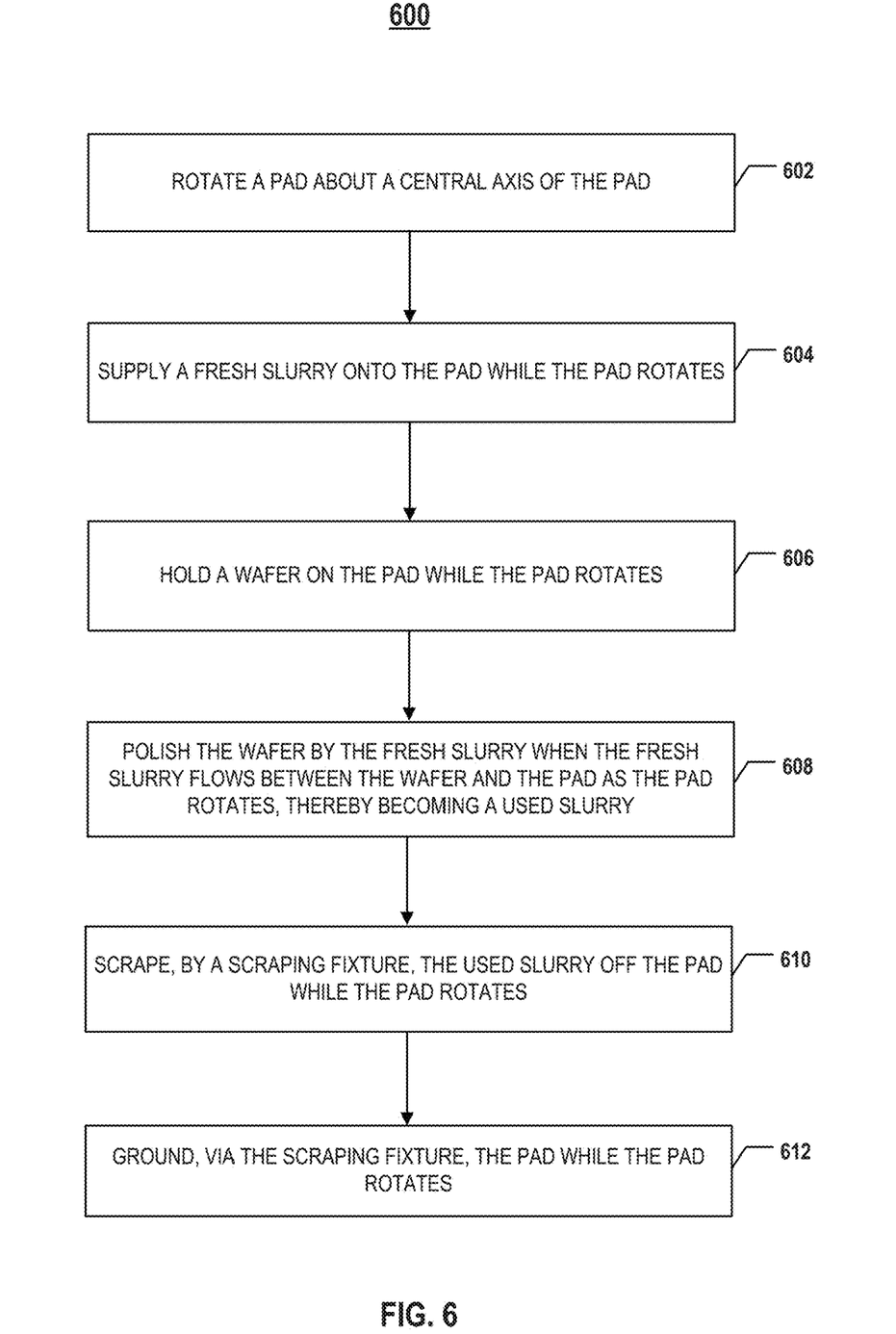
FIG. 6 is a flowchart of an exemplary method for CMP, according to some embodiments of the present disclosure.

FIG. 6 is a flowchart of a method 600 for CMP, according to some embodiments of the present disclosure. Examples of the apparatus that can perform operations of method 600 include apparatus 300 depicted in FIGS. 3-4. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operation 602, in which a pad is rotated about a central axis of the pad. In some embodiments, pad 302 is rotated by platen 301 about the central axis of pad 302.

Method 600 proceeds to operation 604, as illustrated in FIG. 6, in which a fresh slurry is supplied onto the pad while the pad rotates. In some embodiments, fresh slurry 308 is dripped from slurry tube 310 above pad 302 onto the top surface of pad 302. Fresh slurry 308 can include metal protective additive.

Method 600 proceeds to operation 606, as illustrated in FIG. 6, in which a wafer is held on the pad while the pad rotates. In some embodiments, wafer 312 is held by carrier 304, for example, using a retaining ring, while pad 302 rotates.

Method 600 proceeds to operation 608, as illustrated in FIG. 6, in which the wafer is polished by the fresh slurry when the fresh slurry flows between the wafer and the pad as the pad rotates, thereby becoming a used slurry. In some embodiments, because of the rotation of pad 302 (and the resulting centrifugal force), fresh slurry 308 flows to contacting surface 318 between wafer 312 and the top surface of pad 302 and is used for polishing wafer 312. By polishing wafer 312, fresh slurry 308 becomes used slurry 314, which does not include the metal protective additive, which has been consumed by polishing.

Method 600 proceeds to operation 610, as illustrated in FIG. 6, in which the used slurry is scraped off the pad while the pad rotates by a scraping fixture. To scrape off the used slurry, a pressure can be applied against the top surface of the pad to stop the used slurry from rotating with the pad, such that the used slurry flows off the pad along the scraping fixture. In some embodiments, scraping fixture 320 scrapes used slurry 314 off pad 302 while pad 302 rotates. In some embodiments, scraper 322 of scraping fixture 320 applies a pressure at its lower end against the top surface of pad 302 to stop used slurry 314 from rotating with pad 302, such that used slurry 314 flows off pad 302 along scraping fixture 320.

Method 600 proceeds to operation 612, as illustrated in FIG. 6, in which the pad is grounded, via the scraping fixture, while the pad rotates. In some embodiments, conductor 324 of scraping fixture 320 grounds pad 302 while pad 302 rotates to remove the electric charges accumulated on pad 302 during the CMP process.

According to one aspect of the present disclosure, an apparatus for CMP includes a platen, a slurry supply, and at least one scraping fixture. The platen is configured to rotate a pad thereon about a central axis of the pad. The slurry supply is configured to supply a slurry onto the pad while the pad rotates. The at least one scraping fixture is configured to scrape the slurry off the pad when the slurry travels a distance between the slurry supply and the at least one scraping fixture in a circumferential direction of the pad as the pad rotates.

In some embodiments, the at least one scraping fixture includes a scraper including a lower end abutting a top surface of the pad while the pad rotates. The lower end of the scraper can be made of polymer. In some embodiments, the scraper is configured to apply a pressure against the top surface of the pad to stop the slurry from rotating with the pad, such that the slurry flows off the pad along the scraper.

In some embodiments, the at least one scraping fixture includes a conductor electrically coupled to the pad to ground the pad while the pad rotates. In some embodiments, the conductor of the at least one scraping fixture is electrically coupled to the slurry supply.

In some embodiments, the at least one scraping fixture is attached to the slurry supply. In some embodiments, the at least one scraping fixture includes a plurality of scraping fixtures spaced apart along the circumferential direction of the pad.

In some embodiments, the apparatus further includes a carrier configured to hold a wafer on the pad between the slurry supply and the at least one scraping fixture in the circumferential direction of the pad while the pad rotates. The slurry can be scraped off the pad after being used for polishing the wafer.

According to another aspect of the present disclosure, an apparatus for CMP includes a platen, a slurry supply, a carrier, and at least one scraping fixture. The platen is configured to rotate a pad thereon about a central axis of the pad. The slurry supply is configured to supply a fresh slurry onto the pad while the pad rotates. The carrier is configured to hold a wafer on the pad while the pad rotates. The fresh slurry flows between the wafer and the pad as the pad rotates and thereby becomes a used slurry. The at least one scraping fixture is configured to scrape the used slurry off the pad while the pad rotates.

In some embodiments, the at least one scraping includes a scraper including a lower end abutting a top surface of the pad while the pad rotates. The lower end of the scraper can be made of polymer. In some embodiments, the scraper is configured to apply a pressure against the top surface of the pad to stop the used slurry from rotating with the pad, such that the used slurry flows off the pad along the scraper.

In some embodiments, the at least one scraping fixture includes a conductor electrically coupled to the pad to ground the pad while the pad rotates. In some embodiments, the conductor of the at least one scraping fixture is electrically coupled to the slurry supply.

In some embodiments, the at least one scraping fixture is attached to the slurry supply. In some embodiments, the at least one scraping fixture includes a plurality of scraping fixtures spaced apart along the circumferential direction of the pad.

In some embodiments, the at least one scraping fixture is disposed between the carrier and the slurry supply in a circumferential direction of the pad as the pad rotates.

According to still another aspect of the present disclosure, a method for CMP is disclosed. A pad is rotated about a central axis of the pad. A fresh slurry is supplied onto the pad while the pad rotates. A wafer is held on the pad while the pad rotates. The wafer is polished by the fresh slurry when the fresh slurry flows between the wafer and the pad as the pad rotates, thereby becoming a used slurry. The used slurry is scraped off the pad by a scraping fixture while the pad rotates.

In some embodiments, to scrape the used slurry off the pad, a pressure is applied against a top surface of the pad to stop the used slurry from rotating with the pad, such that the used slurry flows off the pad along the scraping fixture.

In some embodiments, the pad is grounded via the scraping fixture while the pad rotates.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. An apparatus for chemical mechanical polishing (CMP), comprising:
   a platen configured to rotate a pad thereon about a central axis of the pad;
   a slurry supply configured to supply a slurry onto the pad while the pad rotates; and
   at least one scraping fixture comprising a conductor electrically coupled to the pad to ground the pad while the pad rotates, the at least one scraping fixture being configured to scrape the slurry off the pad when the slurry travels a distance between the slurry supply and the at least one scraping fixture in a circumferential direction of the pad as the pad rotates, wherein the conductor is electrically coupled to the slurry supply.

2. The apparatus of claim 1, wherein the at least one scraping fixture comprises a scraper including a lower end abutting a top surface of the pad while the pad rotates.

3. The apparatus of claim 2, wherein the lower end of the scraper is made of polymer.

4. The apparatus of claim 2, wherein the scraper is configured to apply a pressure against the top surface of the pad to stop the slurry from rotating with the pad, such that the slurry flows off the pad along the scraper.

5. The apparatus of claim 1, wherein the at least one scraping fixture is attached to the slurry supply.

6. The apparatus of claim 1, wherein the at least one scraping fixture comprises a plurality of scraping fixtures spaced apart along the circumferential direction of the pad.

7. The apparatus of claim 1, further comprising a carrier configured to hold a wafer on the pad between the slurry supply and the at least one scraping fixture in the circumferential direction of the pad while the pad rotates.

8. The apparatus of claim 7, wherein the slurry is scraped off the pad after being used for polishing the wafer.

9. An apparatus for chemical mechanical polishing (CMP), comprising:
   a platen configured to rotate a pad thereon about a central axis of the pad;
   a slurry supply configured to supply a fresh slurry onto the pad while the pad rotates;
   a carrier configured to hold a wafer on the pad while the pad rotates, wherein the fresh slurry flows between the wafer and the pad as the pad rotates and thereby becomes a used slurry; and
   at least one scraping fixture configured to scrape the used slurry off the pad while the pad rotates in a rotation direction,
   wherein:
   along the rotation direction, the fresh slurry flows from the slurry supply, through the wafer on the pad, to the at least one scraping fixture, and the used slurry is scraped by the at least one scraping fixture; and
   one of the at least one scraping fixture is attached to the slurry supply.

10. The apparatus of claim 9, wherein the at least one scraping comprises a scraper including a lower end abutting a top surface of the pad while the pad rotates.

11. The apparatus of claim 10, wherein the lower end of the scraper is made of polymer.

12. The apparatus of claim 10, wherein the scraper is configured to apply a pressure against the top surface of the pad to stop the used slurry from rotating with the pad, such that the used slurry flows off the pad along the scraper.

13. The apparatus of claim 9, wherein the at least one scraping fixture comprises a conductor electrically coupled to the pad to ground the pad while the pad rotates.

14. The apparatus of claim 13, wherein the conductor of the at least one scraping fixture is electrically coupled to the slurry supply.

15. The apparatus of claim 9, wherein the at least one scraping fixture comprises a plurality of scraping fixtures spaced apart along a circumferential direction of the pad.

16. The apparatus of claim 9, wherein the at least one scraping fixture is disposed between the carrier and the slurry supply in a circumferential direction of the pad as the pad rotates.

17. The apparatus of claim 9, wherein the one of the at least one scraping fixture extends from the slurry supply substantially toward a center of the pad.

18. The apparatus of claim 9, wherein:
the one of the at least one scraping fixture is a first scraping fixture; and
the at least one scraping fixture comprises a second scraping fixture, the second scraping fixture being fixed with respect to the pad.

19. The apparatus of claim 18, wherein the first scraping fixture and the second scraping fixture are substantially identical.

20. A method for chemical mechanical polishing (CMP), comprising:
rotating a pad about a central axis of the pad;
supplying, by a slurry supply, a fresh slurry onto the pad while the pad rotates;
holding a wafer on the pad while the pad rotates;
polishing the wafer by the fresh slurry when the fresh slurry flows between the wafer and the pad as the pad rotates, thereby becoming a used slurry; and
scraping, by a scraping fixture, the used slurry off the pad while the pad rotates,
wherein:
the scraping fixture comprises a conductor electrically coupled to the pad to ground the pad while the pad rotates; and
the conductor is electrically coupled to the slurry supply.

* * * * *